United States Patent
Chung et al.

(10) Patent No.: US 8,810,552 B2
(45) Date of Patent: Aug. 19, 2014

(54) SCAN DRIVING DEVICE AND DRIVING METHOD THEREOF

(75) Inventors: Bo-Yong Chung, Yongin-si (KR); Yong-Sung Park, Yongin-si (KR); Deok-Young Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 132 days.

(21) Appl. No.: 13/594,742

(22) Filed: Aug. 24, 2012

(65) Prior Publication Data

US 2013/0285888 A1 Oct. 31, 2013

(30) Foreign Application Priority Data

Apr. 26, 2012 (KR) .................. 10-2012-0043970

(51) Int. Cl.
*G09G 3/20* (2006.01)
(52) U.S. Cl.
USPC ............... 345/204; 345/55; 345/76; 345/100
(58) Field of Classification Search
CPC ................................. G09G 5/00; G09G 3/30
USPC ............ 345/55, 76, 100, 204; 377/64, 74, 98; 327/108
See application file for complete search history.

(56) References Cited

U.S. PATENT DOCUMENTS

| | | | | | |
|---|---|---|---|---|---|
| 6,091,393 | A | * | 7/2000 | Park | 345/100 |
| 6,392,627 | B1 | * | 5/2002 | Maekawa | 345/98 |
| 8,570,309 | B2 | * | 10/2013 | Jeong | 345/204 |
| 2007/0086558 | A1 | * | 4/2007 | Wei et al. | 377/64 |

FOREIGN PATENT DOCUMENTS

| | | |
|---|---|---|
| JP | 2010-186551 A | 8/2010 |
| KR | 10-2004-0003287 A | 1/2004 |
| KR | 10-2010-0005302 | 1/2010 |
| KR | 10-2011-0104320 A | 9/2011 |
| KR | 10-2012-0058204 | 6/2012 |

* cited by examiner

*Primary Examiner* — Andrew Sasinowski
(74) *Attorney, Agent, or Firm* — Christie, Parker & Hale, LLP

(57) ABSTRACT

A scan driver includes scan driving blocks, each including: a first transistor including a gate coupled to a first node and receiving a first clock signal, a first electrode receiving an output control signal, and a second electrode coupled to a scan line at first output; a second transistor including a gate coupled to a second node receiving an input signal according to a second clock signal, and first and second electrodes respectively coupled to a third clock input and the first output; a third transistor including a gate coupled to the first node, a first electrode receiving the output control signal, and a second electrode coupled to an input terminal of a next scan driving block at a second output; and a fourth transistor including a gate coupled to the second node, and first and second electrodes respectively coupled to the third clock input and the second output.

26 Claims, 10 Drawing Sheets

SCAN DRIVING DEVICE AND DRIVING METHOD THEREOF

CROSS-REFERENCE TO RELATED APPLICATION

This application claims priority to and the benefit of Korean Patent Application No. 10-2012-0043970 filed in the Korean Intellectual Property Office on Apr. 26, 2012, the entire contents of which are incorporated herein by reference.

BACKGROUND

1. Field

The present invention relates to a scan driving apparatus and a driving method thereof.

2. Description of the Related Art

A display area of a display device includes a plurality of pixels that are coupled to a plurality of scan lines and a plurality of data lines and arranged substantially in a matrix format. For displaying an image, the display device sequentially applies a gate-on voltage to the plurality of scan lines and applies a data signal corresponding to a scan signal of the gate-on voltage to the plurality of data lines.

A scan driver includes a plurality of scan driving blocks that are coupled to the plurality of scan lines and sequentially arranged. When the scan signals of previously arranged scan driving blocks are input, the plurality of scan driving blocks sequentially output the scan signals of the gate-on voltage by outputting the scan signals of the plurality of scan driving blocks.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to provide a scan driver that is stable to erroneous operation such as static electricity, short-circuit between wires, or coupling, and a method for driving the same.

A scan driver according to an exemplary embodiment of the present invention includes a plurality of sequentially arranged scan driving blocks. Each of the scan driving blocks includes: a first transistor including a gate electrode coupled to a first node to which a clock signal input to a first clock signal input terminal is input, a first electrode to which an output control signal is input, and a second electrode coupled to a first output terminal; a second transistor including a gate electrode coupled to a second node to which an input signal is transmitted according to a clock signal input to a second clock signal input terminal, a first electrode coupled to a third clock signal input terminal, and a second electrode coupled to the first output terminal; a third transistor including a gate electrode coupled to the first node, a first electrode to which the output control signal is input, and a second electrode coupled to a second output terminal; and a fourth transistor including a gate electrode coupled to the second node, a first electrode coupled to the third clock signal input terminal, and a second electrode coupled to the second output terminal. The first output terminal is coupled to a scan line, and the second output terminal is coupled to an input signal input terminal of a next scan driving block of the scan driving blocks.

When a scan signal is output to the first output terminal, an input signal input to the input signal input terminal of the next scan driving block may be output to the second output terminal.

The scan signal output to the first output terminal and the input signal output to the second output terminal may have substantially the same waveform.

Each of the scan driving blocks may further include a first capacitor including a first electrode coupled to the second node and a second electrode coupled to the first output terminal.

Each of the scan driving blocks may further include a second capacitor including a first electrode to which the output control signal is applied and a second electrode coupled to the first node.

Each of the plurality of scan driving blocks may further include a fifth transistor including a gate electrode to which the output control signal is input, a first electrode coupled to a first power source, and a second electrode coupled to the second node.

Each of the plurality of scan driving blocks may further include a sixth transistor including a gate electrode coupled to the second clock signal input terminal, a first electrode to which the input signal is input, and a second electrode coupled to the second node.

Each of the scan driving blocks may further include a seventh transistor including a gate electrode coupled to the first clock signal input terminal, a first electrode coupled to the first clock signal input terminal, and a second electrode coupled to the first node.

Each of the scan driving blocks may further include an eighth transistor including a gate electrode coupled to the second node, a first electrode coupled to the first clock signal input terminal, and a second electrode coupled to the first node.

Each of the scan driving blocks may further include a ninth transistor including a gate electrode coupled to the first node and a first electrode to which the output control signal is applied and a tenth transistor including a gate electrode coupled to the third clock signal input terminal, a first electrode coupled to the second electrode of the ninth transistor, and a second electrode coupled to the second node.

Each of the scan driving blocks may further include an eighth transistor including a gate electrode to which the input signal is input and a first electrode coupled to the first clock signal input terminal and a ninth transistor including a gate electrode coupled to the second clock signal input terminal, a first electrode coupled to the second electrode of the eighth transistor, and a second electrode coupled to the first node.

Each of the scan driving blocks may further include a tenth transistor including a gate electrode coupled to the first node and a first electrode to which the output control signal is applied; and an eleventh transistor including a first electrode coupled to the third clock signal input terminal, a first electrode coupled to the second electrode of the tenth transistor, and a second electrode coupled to the second node.

Each of the scan driving blocks may further include a seventh transistor including a gate electrode coupled to the first clock signal input terminal, a first electrode coupled to a second power source, and a second electrode coupled to the first node.

Each of the scan driving blocks may further include an eighth transistor including a gate electrode coupled to the second node, a first electrode coupled to the first clock signal input terminal, and a second electrode coupled to the first node.

Each of the scan driving blocks may further include a ninth transistor including a gate electrode coupled to the first node and a first electrode to which the output control signal is applied and a tenth transistor including a gate electrode coupled to the third clock signal input terminal, a first electrode coupled to the second electrode of the ninth transistor, and a second electrode coupled to the second node.

A first clock signal may be input to the first clock signal input terminals and the second clock signal input terminals of a plurality of first scan driving blocks of the scan driving blocks, and a second clock signal may be input to the third clock signal input terminals of the first scan driving blocks, and the second clock signal may be input to the first clock signal input terminals and the second clock signal input terminals of a plurality of second scan driving blocks of the scan driving blocks, and the first clock signal is input to the third clock signal input terminals of the second scan driving blocks.

The second clock signal may be shifted from the first clock signal by a duty of the first clock signal.

A Scan signal of previous second scan driving blocks of the second scan driving blocks may be input to the input signal input terminals of the first scan driving blocks, and scan signals of previous first scan driving blocks of the first scan driving blocks may be input to the input signal input terminals of the second scan driving blocks.

A first clock signal may be input to the first clock signal input terminal of a first scan driving block of the scan driving blocks, a second clock signal may be input to a second clock signal input terminal of the first scan driving block, and a third clock signal may be input to the third clock signal input terminal of the first scan driving block, the second clock signal may be a signal shifted from the first clock signal by ½ duty of the first clock signal, and the third clock signal may be a signal shifted from the second clock signal by ½ duty of the second clock signal.

The second clock signal may be input to the first clock signal input terminal of a second scan driving block of the scan driving blocks, the third clock signal may be input to the second clock signal input terminal of the second driving block, and a fourth clock signal that is a signal shifted from the third clock signal by ½ duty of the third clock signal, may be input to the third clock signal input terminal of the second scan driving block.

The third clock signal may be input to the first clock signal input terminal of a third scan driving block of the scan driving blocks, the fourth clock signal may be input to the second clock signal input terminal of the third scan driving block, and the first clock signal may be input to the third clock signal input terminal of the third scan driving block.

The fourth clock signal may be input to a first clock signal input terminal of a fourth scan driving block of the scan driving blocks, the first clock signal may be input to the second clock signal input terminal of the fourth scan driving block, and the second clock signal may be input to the third clock signal input terminal of the fourth scan driving block.

A method according to another exemplary embodiment of the present invention is provided to drive a scan driver including a plurality of scan driving blocks, each including a first transistor having a gate electrode coupled to a first node and transmitting an output control signal to a first output terminal, a second transistor having a gate electrode coupled to a second node and transmitting a first clock signal to the first output terminal, a third transistor having a gate electrode coupled to the first node and transmitting the output control signal to a second output terminal, a fourth transistor having a gate electrode coupled to the second node and transmitting the first clock signal to the second output terminal, and a capacitor coupled to the second node and the first output terminal. The method includes: changing the first clock signal to a gate-on voltage; turning on the second transistor and the fourth transistor by a bootstrap through the capacitor; outputting the first clock signal of the gate-on voltage as a scan signal to the first output terminal; and outputting the first clock signal of the gate-on voltage as an input signal of the next scan driving block to the second output terminal.

The method for driving the scan driver may further include: applying an input signal of a gate-on voltage output through the second output terminal of a previously arranged scan driving block of the scan driving blocks, to the second node before the first clock signal is changed to the gate-on voltage; turning on the second transistor by the gate-on voltage of the second node and outputting the first clock signal of a gate-off voltage as the scan signal to the first output terminal; and charging the capacitor with the gate-on voltage of the second node and the gate-off voltage of the output terminal.

The method for driving the scan driver may include: changing a voltage of the first node according to the output control signal of the gate-on voltage, concurrently applied to the scan driving blocks; turning on the first transistor by the changing of the voltage of the first node and outputting the outputting control signal of the gate-on voltage as the scan signal to the first output terminal; and turning on the third transistor by the changing of the voltage of the first node and outputting the output control signal of the gate-on voltage as an input signal of a next scan driving block of the scan driving blocks, to the second output terminal.

The method for driving the scan driver may further include transmitting a gate-off voltage to the second node according to the output control signal of the gate-on voltage.

The above-stated scan driver can reduce or minimize erroneous operation of the scan driver due to erroneous operation that may occur in a display area, such as static electricity, short-circuit between wires, coupling, and the like.

In addition, when an error occurs in an output terminal of one of the scan driving blocks, the next scan driving block can normally output a scan signal.

DETAILED DESCRIPTION OF THE EMBODIMENTS

Figure 1:
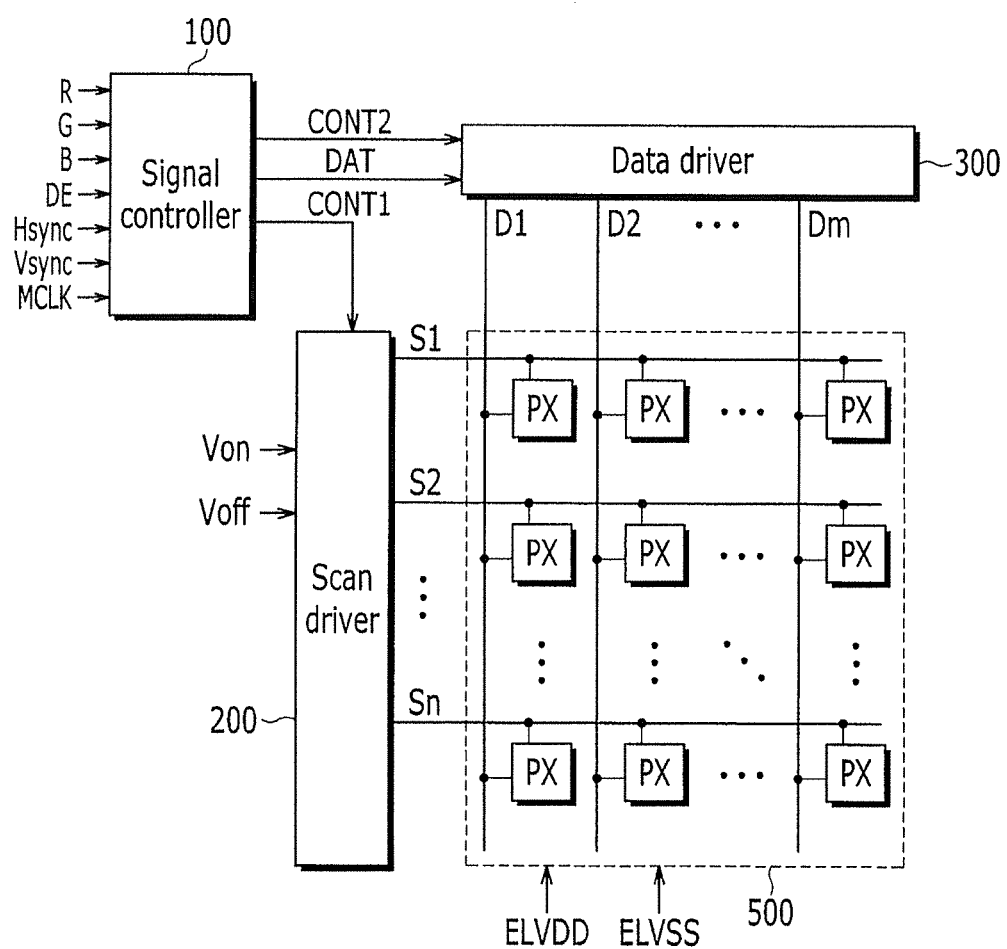
FIG. 1 is a block diagram of a display device according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention.

In addition, in various exemplary embodiments, the same reference numerals are used in respect to the constituent elements having the same constitution and having been illustrated in the first exemplary embodiment. For example, in second, third, and fourth exemplary embodiments, only the constitution that is different from the first exemplary embodiment may be illustrated.

The drawings and description are to be regarded as illustrative in nature and not restrictive, and like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

The display area of the display device may experience erroneous operation due to static electricity, short-circuit between wires, or coupling. The erroneous operation in the display area due to static electricity, short-circuit between wires, or coupling may cause a voltage level of the scan line to be changed. When a voltage level of one of the plurality of scan lines is changed, a scan signal of the next scan driving block cannot be normally output. That is, the scan driver may not normally output scan signals.

FIG. 1 is a block diagram of a display device according to an exemplary embodiment of the present invention.

Referring to FIG. 1, the display device includes a signal controller 100, a scan driving apparatus (e.g., a scan driver) 200, a data driver 300, and a display unit 500.

The signal controller 100 receives video signals R, G, and B input from an external device and an input control signal for controlling displaying of the video signals. The video signals R, G, and B include luminance information of each pixel PX, and the luminance has a predetermined number of grays, for example, $1024=2^{10}$, $256=2^8$, or $64=2^6$. The input control signal (or input control signals), for example, may include a vertical synchronization signal Vsync, a horizontal synchronization signal Hsync, a main clock MCLK, and a data enable signal DE.

The signal controller 100 properly processes the input video signals R, G, and B based on the input video signals R, G, and B and the input control signal according to an operation condition of the display unit 500 and the data driver 300, and generates a scan control signal CONT1, a data control signal CONT2, and an image data signal DAT. The signal controller 100 transmits the scan control signal CONT1 to the scan driving apparatus 200. The signal controller 100 transmits the data control signal CONT2 and the image data signal DAT to the data driver 300.

The display unit 500 includes a plurality of scan lines S1-Sn, a plurality of data lines D1-Dm, and a plurality of pixels PX coupled to the plurality of signal lines S1-Sn and D1-Dm and arranged approximately in a matrix format. The plurality of scan lines 51-Sn are extended substantially in a row direction and are substantially parallel with each other. The plurality of data lines D1-Dm are substantially extended in a column direction and are substantially parallel with each other. The plurality of pixels PX of the display unit 500 receives a first power source voltage ELVDD and a second power source voltage ELVSS.

The scan driving apparatus 200 is coupled to the plurality of scan lines S1-Sn, and applies a scan signal to the plurality of scan lines S1 to Sn. The scan signal is formed of a combination of a gate-on voltage Von that turns on application of a data signal with respect to the pixel PX and a gate-off voltage Voff that turns off the application of the data signal according to the scan control signal CONT1.

The scan control signal CONT1 includes a scan start signal SSP, a clock signal SCLK, and an output control signal SGCK. The scan start signal SSP is a signal that generates the first scan signal for displaying an image of a frame. The clock signal SCLK is a synchronization signal for sequential application of the scan signal to the plurality of scan lines S1-Sn. The output control signal SGCK is a signal for controlling collective application of the scan signal to the plurality of scan lines S1-Sn.

The data driver 300 is coupled to the plurality of data lines D1-Dm, and selects a gray voltage according to the image data signal DAT. The data driver 300 applies a gray voltage selected according to the data control signal CONT2 to the plurality of data lines D1 to Dm as a data signal.

Each of the drivers 100, 200, and 300 described above may be mounted outside a pixel area as at least one integrated circuit, mounted on a flexible printed circuit film, attached to the display unit 400, as a tape carrier package (TCP), mounted on a separate printed circuit board, or integrated outside the pixel area together with the signal lines S1-Sn and D1-Dm.

The display device according to the present exemplary embodiment of the present invention may be driven in a concurrent (e.g., simultaneous) light-emitting mode using a frame which includes a scan period in which the data signal is transferred to and written in each of the plurality of pixels PX and a light emitting period in which the light is emitted according to the data signal written in each of the plurality of pixels PX.

Figure 2:
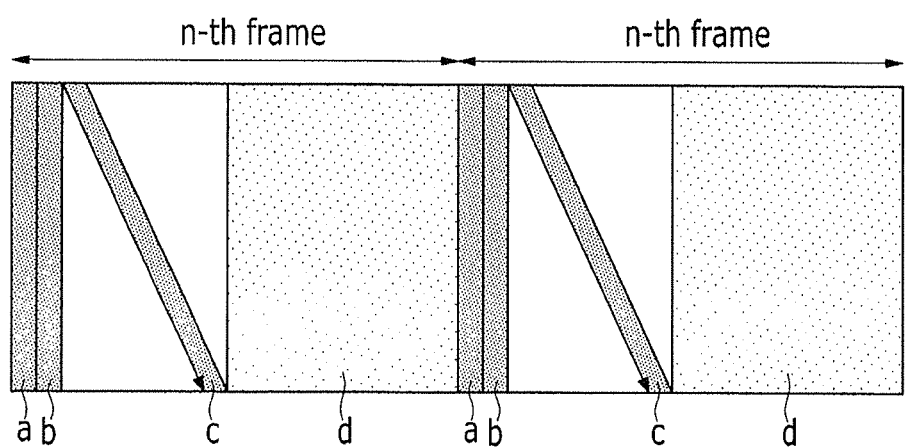
FIG. 2 is driving operation of a concurrent (e.g., simultaneous) emission type display device.

FIG. 2 shows a driving operation of a concurrent (e.g., simultaneous) light-emitting mode of a display device according to an exemplary embodiment of the present invention.

Referring to FIG. 2, the display device according to the exemplary embodiment of the present invention is described as an organic light emitting diode display using an organic light emitting diode. However, the present invention is not limited thereto, and it may be applied to various display devices.

The driving method of the display device includes a reset step (a) for resetting a driving voltage of an organic light emitting diode of a pixel, a compensating step (b) for compensating a threshold voltage of a driving transistor of a pixel, a scanning step (c) for transmitting a data signal to each of the plurality of pixels, and a light emission step (d) for light emission of the plurality of pixels according to the data signal.

As shown in the drawing, the scanning step (c) is sequentially performed for each scan line, but the resetting step (a), the threshold voltage compensating step (b) and the light emission step (d) are concurrently (e.g., simultaneously) performed throughout the display unit 500.

Here, the scan driving apparatus 200 of the display device according to the present exemplary embodiment sequentially applies the scan signal of the gate-on voltage Von to the plurality of scan lines S1 to Sn in the scanning step (c) and concurrently (e.g., simultaneously) applies the scan signal of the gate-on voltage Von to the plurality of scan lines S1 to Sn in the resetting step (a) and the compensating step (b). That is, the scan driving apparatus 200 sequentially or concurrently (e.g., simultaneously) applies the scan signal according to a driving step of the display device.

Figure 3:
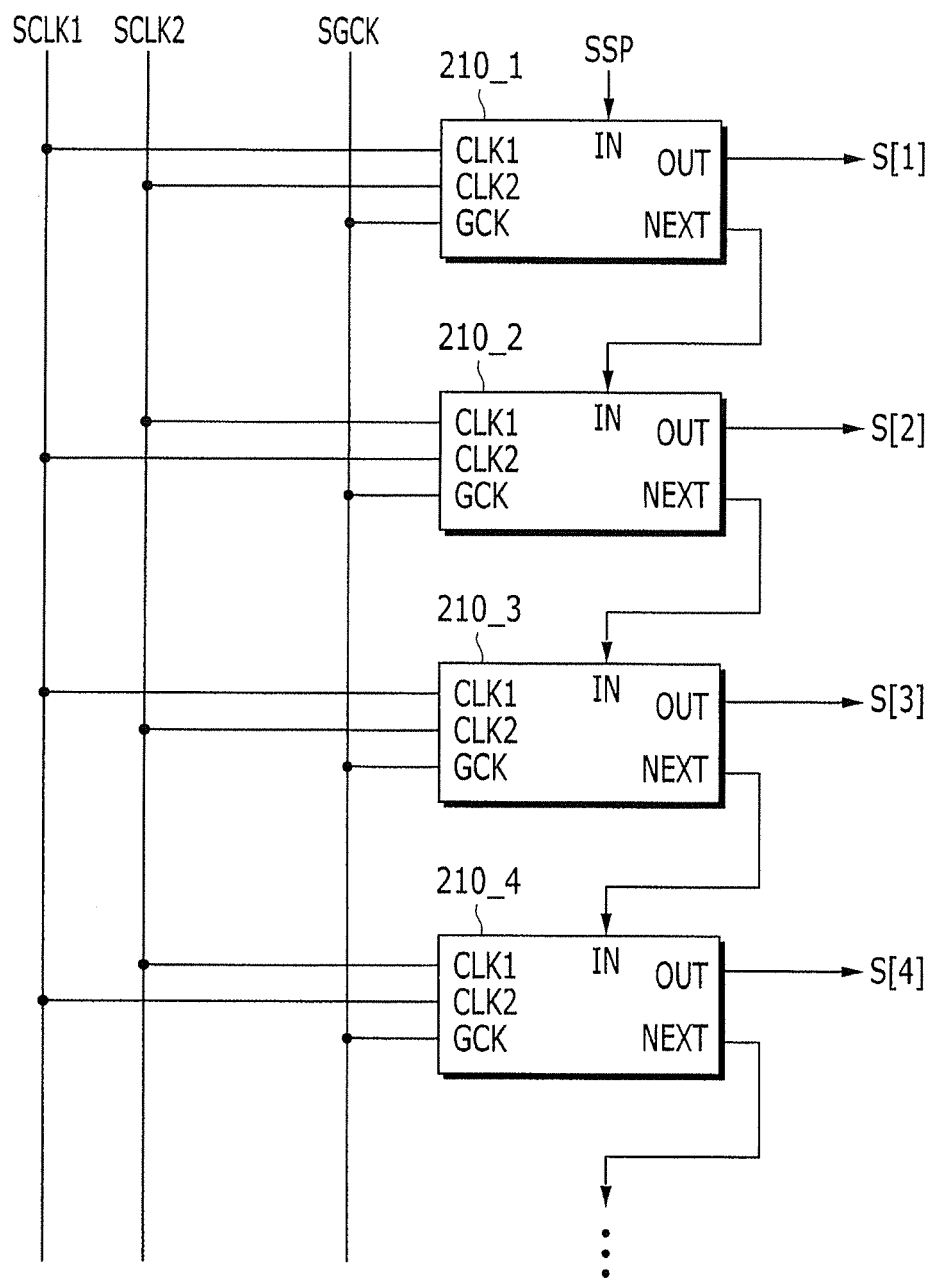
FIG. 3 is a block diagram of a configuration of a scan driving device according to an exemplary embodiment of the present invention.

FIG. 3 is a block diagram of a configuration of the scan driving apparatus according to the exemplary embodiment of the present invention.

Referring to FIG. 3, the scan driver includes a plurality of sequentially arranged scan driving blocks 210_1, 210_2, 210_3, 210_4, etc. Each of the scan driving blocks 210_1, 210_2, 210_3, 210_4, etc. receives an input signal and generates scan signals S[1], S[2], S[3], S[4], etc. respectively coupled to the plurality of scan lines S1 to Sn.

Each of the plurality of scan driving blocks 210_1, 210_2, 210_3, 210_4, etc., includes a first clock signal input terminal CLK1, a second clock signal input terminal CLK2, an output control signal input terminal GCK, an input signal input terminal IN, a first output terminal OUT, and a second output terminal NEXT.

A first clock signal input terminal CLK1 of each of odd-numbered scan driving blocks 210_1, 210_3, etc., of the plurality of scan driving blocks 210_1, 210_2, 210_3, 210_4, etc., is applied with a first clock signal SCLK1, and a second clock signal input terminal CLK2 thereof is applied with a second clock signal SCLK2. In addition, a first clock signal input terminal CLK1 of each of even-numbered scan driving blocks of the plurality of scan driving blocks 210_1, 210_2, 210_3, 210_4, etc., is applied with the second clock signal SCLK2, and a second clock signal input terminal CLK2 thereof is applied with the first clock signal SCLK1.

An output control signal input terminal GCK of each of the plurality of scan driving blocks 210_1, 210_2, 210_3, 210_4, etc., is applied with an output control signal SGCK.

A first output terminal OUT of each of the plurality of scan driving blocks 210_1, 210_2, 210_3, 210_4, etc., is coupled to a corresponding scan line of each of the plurality of scan driving blocks 210_1, 210_2, 210_3, 210_4, etc. The scan driving blocks 210_1, 210_2, 210_3, 210_4, etc., output scan signals S[1], S[2], S[3], S[4], etc., generated according to signals input to the first clock signal input terminal CLK1, the second clock signal input terminal CLK2, the output control signal input terminal GCK, and the input signal input terminal IN to the first output terminal OUT.

A second output terminal NEXT of each of the plurality of scan driving blocks 210_1, 210_2, 210_3, 210_4, etc., is coupled with an input signal input terminal IN of a corresponding one of the scan driving blocks arranged next to the plurality of scan driving blocks 210_1, 210_2, 210_3, 210_4, etc. Each of the scan driving blocks 210_1, 210_2, 210_3, 210_4, etc., outputs an input signal input to the input signal input terminal IN of the next arranged scan driving block of the scan driving blocks, to a second output terminal NEXT when the scan signal is output to the first output terminal OUT. The scan signal output to the first output terminal OUT and the input signal output to the second output terminal NEXT have substantially the same waveform.

That is, the input signals output through the second output terminal NEXT of the previous scan driving blocks are input to the input signal terminals IN of respective next ones of the plurality of scan driving blocks 210_1, 210_2, 210_3, 210_4, etc. Input signals output through the second output terminals NEXT of even-numbered scan driving blocks of the previous scan driving blocks are input to respective input signal input terminals of odd-numbered scan driving blocks. The input signals output through the second output terminals NEXT of the odd-numbered scan driving blocks arranged in front are input to respective input signal input terminals IN of even-numbered scan driving blocks. In this case, the input signal input terminal IN of the first scan driving block 210_1 is applied with a scan start signal SSP.

Figure 4:
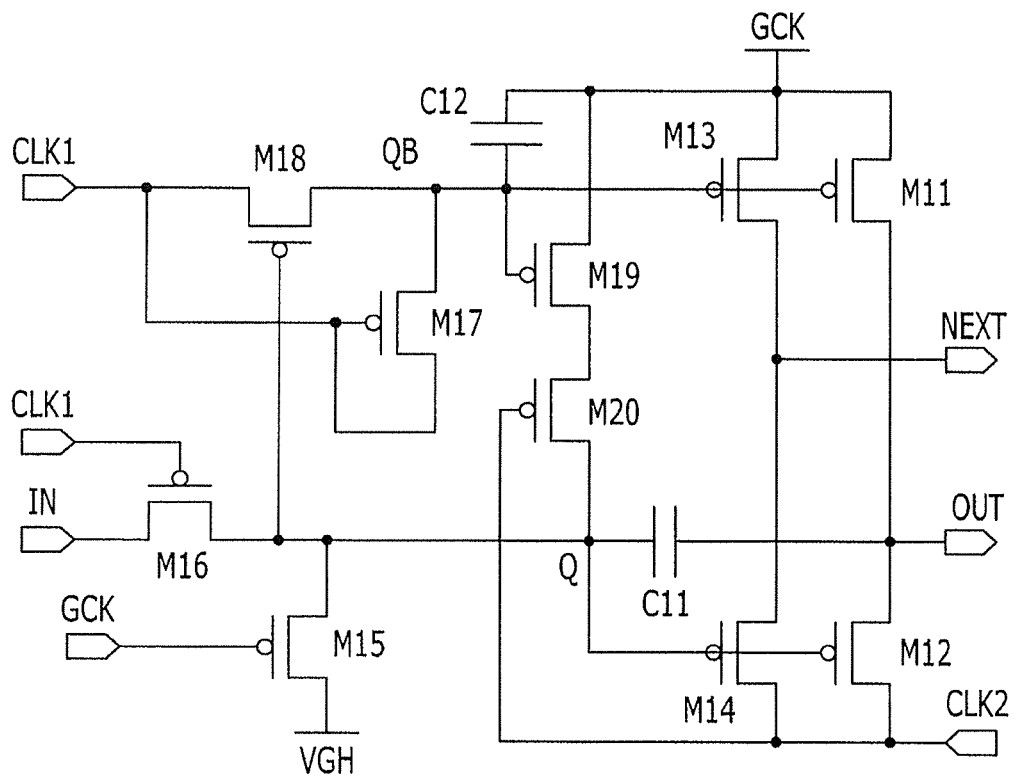
FIG. 4 is a circuit diagram of a scan driving block included in the scan driving device of FIG. 3 according to an exemplary embodiment of the present invention.

FIG. 4 is a circuit diagram of a scan driving block included in the scan driver of FIG. 3 according to an exemplary embodiment of the present invention.

Referring to FIG. 4, the scan driving block includes a plurality of transistors M11, M12, M13, M14, M15, M16, M17, M18, M19, and M20, and a plurality of capacitors C11 and C12.

The first transistor M11 includes a gate electrode coupled to a first node QB, a first electrode coupled to the output control signal input terminal GCK, and a second electrode coupled to the first output terminal OUT.

The second transistor M12 includes a gate electrode coupled to a second node Q, a first electrode coupled to the second clock signal input terminal CLK2, and a second electrode coupled to the first output terminal OUT.

The third transistor M13 includes a gate electrode coupled to the first node QB, a first electrode coupled to the output control signal input terminal GCK, and a second electrode coupled to the second output terminal NEXT.

The fourth transistor M14 includes a gate electrode coupled to the second node Q, a first electrode coupled to the second clock signal input terminal CLK2, and a second electrode coupled to the second output terminal NEXT.

The fifth transistor M15 includes a gate electrode coupled to the output control signal input terminal GCK, a first electrode coupled to a first power source voltage VGH, and a second electrode coupled to the second node Q.

The sixth transistor M16 includes a gate electrode coupled to the first clock signal input terminal CLK1, a first electrode coupled to the input signal input terminal IN, and a second electrode coupled to the second node Q.

The seventh transistor M17 includes a gate electrode coupled to the first clock signal input terminal CLK1, a first electrode coupled to the first clock signal input terminal CLK1, and a second electrode coupled to the first node QB.

The eighth transistor M18 includes a gate electrode coupled to the second node Q, a first electrode coupled to the first clock signal input terminal CLK1, and a second electrode coupled to the first node QB.

The ninth transistor M19 includes a gate electrode coupled to the first node QB, a first electrode coupled to the output control signal input terminal GCK, and a second electrode coupled to a first electrode of the tenth transistor M20.

The tenth transistor M20 includes a gate electrode coupled to the second clock signal input terminal CLK2, the first electrode coupled to the second electrode of the ninth transistor M19, and a second electrode coupled to the second node Q.

The first capacitor C11 includes a first electrode coupled to the second node Q and a second electrode coupled to the first output terminal OUT. The second capacitor C12 includes a first electrode coupled to the output control signal input terminal GCK and a second electrode coupled to the first node QB.

The plurality of transistors M11, M12, M13, M14, M15, M16, M17, M18, M19, and M20 are p-channel field effect transistors in the described embodiment, but the present invention is not limited thereto. A gate-on voltage that turns on the plurality of transistors M11, M12, M13, M14, M15, M16, M17, M18, M19, and M20 is a logic low-level voltage, and a gate-off voltage that turns off the transistors is a logic high-level voltage. Here, the plurality of transistors M11, M12, M13, M14, M15, M16, M17, M18, M19, and M20 are described as p-channel field effect transistors, but the plurality of transistors M11, M12, M13, M14, M15, M16, M17, M18, M19, and M20 may be n-channel field effect transistors, or any other suitable transistors known to those skilled in the art. A gate-on voltage that turns on the n-channel field effect transistors is a logic high-level voltage and a gate-off voltage that turns off the n-channel field effect transistors is a logic low-level voltage.

Figure 5:
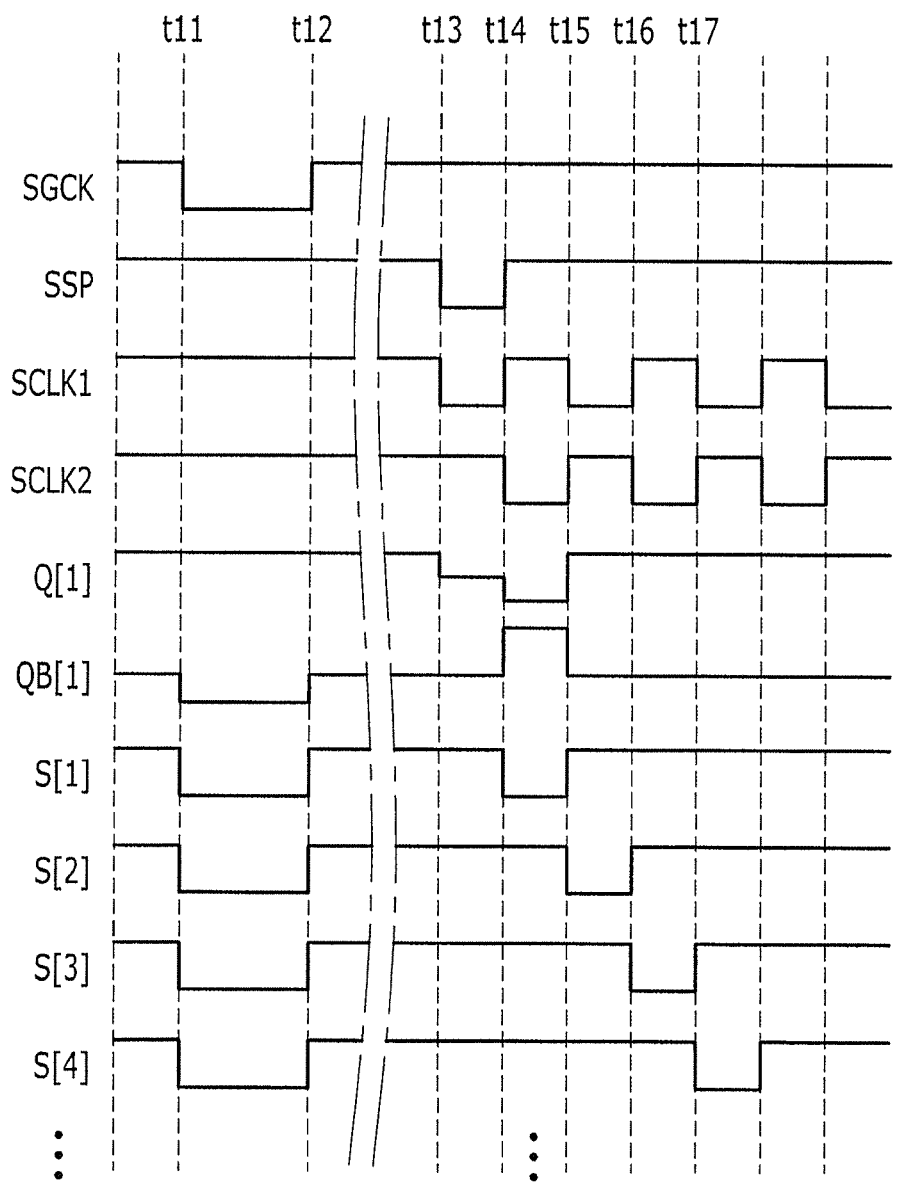
FIG. 5 is timing diagram for illustrating a driving method of the scan driving device of FIG. 3.

FIG. 5 is a timing diagram for illustrating a driving method of the scan driver of FIG. 3.

Referring to FIG. 3 to FIG. 5, voltage levels of the first and second nodes QB[1] and Q[1] (e.g., corresponding to the first and second nodes QB and Q shown in FIG. 4) of the first scan driving block 210_1 and operation of the first scan driving block 210_1 will be described first for better understanding and ease of description.

The scan driver outputs scan signals of the gate-on voltage concurrently (e.g., simultaneously) to the plurality of scan lines S1-Sn during a reset step (a) and a threshold voltage compensation step (b), and sequentially outputs scan signals of the gate-on voltage to the plurality of scan line S1-Sn during a scan step (c).

A period t11 to t12 indicates one of the reset step (a) and the threshold voltage compensation step (b) during which the scan signals of the gate-on voltage are concurrently (e.g., simultaneously) output to the plurality of scan lines S1-Sn.

During the period t11 to t12, the output control signal SGCK is applied with a logic low-level voltage, and the scan start signal SSP, the first clock signal SCLK1, and the second clock signal SCLK2 are applied with a logic high-level voltage. The sixth transistor M16, the seventh transistor M17, and the tenth transistor M20 are turned off by the logic high-level signal. The fifth transistor M15 is turned on by the output control signal SGCK. The first power source voltage VGH is transmitted to the second node Q[1] through the turn-on fifth transistor M15. The first power source voltage VGH is a logic high-level voltage. The second transistor M12, the fourth transistor M14, and the eighth transistor M18 are turned off by the logic high-level voltage of the second node Q[1].

During the period t11 to t12, the first node QB[1] where the gate electrode of the first transistor M11 and the gate electrode of third transistor M13 are coupled is in a floated state. During a period other than the period t11 to t12, a voltage of the first node QB[1] is maintained with the logic low-level, excluding a period during which the scan signal of the gate-on voltage is output to the first output terminal OUT. Thus, the first node QB[1] in the floated state has a voltage of the logic low level or a voltage close to the logic low level. When the output control signal SGCK is lowered to the logic low level from the logic high level at the time t11, the voltage of the first node QB[1] in the floated state becomes lower than the logic low-level voltage by coupling of the second capacitor C12. Accordingly, the first transistor M11 and the third transistor M13 are in the turn-on state. In addition, the logic low-level output control signal SGCK is output as a scan signal through the first output terminal OUT, and the logic low-level output control signal SGCK is output as an input signal of the next scan driving block through the second output terminal NEXT.

During the period t11 to t12, the signals input to the plurality of scan driving blocks 210_1, 210_2, 210_3, 210_4, etc., are equivalent to each other, and therefore the plurality of scan driving blocks 210_1, 210_2, 210_3, 210_4, etc., concurrently (e.g., simultaneously) output logic low-level scan signals S[1], S[2], S[3], S[4], etc.

A period after t13 is a period of the scan step (c) during which the scan signals of the gate-on voltage are sequentially output to the plurality of scan lines S1-Sn. During the period after t13, the output control signal SGCK is applied as a logic high-level voltage.

The scan start signal SSP is applied as a logic low level during a period t13 to t14. The first clock signal SCLK1 is applied with logic low-level during the period t13 to t14 and applied with logic high-level during a period t14 to t15, and a voltage of the first clock signal SCLK1 is iteratively (or alternatively) changed to the logic low-level and the logic high-level. The second clock signal SCLK2 is a first clock signal SCLK1 shifted by a duty (or duty cycle) of the first clock signal SCLK1. The duty of the clock signal in one embodiment refers to a period during which a voltage that turns on the transistors included in a scan driving block, is applied.

During the period t13 to t14, a logic low-level scan start signal SSP is applied to the input signal input terminal IN of the first scan driving block 210_1, a logic low-level first clock signal SCLK1 is applied to the first clock signal input terminal CLK1, and a logic high-level second dock signal SCLK1 is applied to the second clock signal input terminal CLK2. The sixth transistor M16 and the seventh transistor M17 are turned on by the first clock signal SCLK1. The logic low-level first clock signal SCLK1 is transmitted to the first node QB[1], and the logic low-level scan start signal SSP is transmitted to the second node Q[1]. The first transistor M11 and the third transistor M13 are turned on by the logic low-level voltage of the first node QB[1], and the second transistor M12 and the fourth transistor M14 are turned on by the logic low-level voltage of the second node Q[1]. Since the output control signal SGCK and the second clock signal SCLK2 have the logic high-level voltage, a logic high-level scan signal S[1] is output to the first output terminal OUT. In this case, the first capacitor C11 is charged by a voltage that corresponds to a voltage difference between the logic low-level voltage of the second node Q[1] and the logic high-level voltage of the first output terminal OUT. In addition, a logic high-level input signal is output to the second output terminal NEXT. The input signal output through the second output terminal NEXT has substantially the same waveform as the scan signal S[1] output through the first output terminal OUT, and therefore the waveform of the input signal will not be illustrated.

During a period t14 to t15, the first clock signal SCLK1 is applied as logic high-level and the second clock signal SCLK2 is applied as logic low-level. The sixth transistor M16 and the seventh transistor M17 are turned off by the first clock signal SCLK1. As the voltage of the second clock signal SCLK2 is decreased to the logic low-level from the logic high-level at the time t14, the voltage of the second node Q[1] becomes lower than the logic low-level by a bootstrap through the first capacitor C11. Accordingly, the second transistor M12 and the fourth transistor M14 are completely turned on. In addition, the logic low-level second clock signal SCLK2 is output as the scan signal S[1] through the first output terminal OUT. The logic low-level second clock signal SCLK2 is output as an input signal of the second scan driving block 210_1 through the second output terminal NEXT. Meanwhile, the eighth transistor M18 is turned on by the voltage of the second node Q[1] and the logic high-level first clock signal SCLK1 is transmitted to the first node QB[1]. The first transistor M11 and the third transistor M13 are turned off by the voltage of the first node QB[1].

During a period t15 to t16, the first clock signal SCLK1 is applied as the logic low-level and the second clock signal SCLK2 is applied as the logic high-level. The sixth transistor M16 and the seventh transistor M17 are turned on by the first clock signal SCLK1. The logic low-level first clock signal SCLK1 is transmitted to the first node QB[1] through the turn-on seventh transistor M17. In addition, the logic high-level scan start signal SSP is transmitted to the second node Q[1] through the sixth transistor M16. The second transistor M12 and the fourth transistor M14 are turned off by the voltage of the second node Q[1]. The first transistor M11, the third transistor M13, and the ninth transistor M19 are turned on by the voltage of the first node QB[1]. The logic high-level output control signal SGCK is output as the scan signal S[1] through the first output terminal OUT. In addition, the logic high-level output control signal SGCK is output as an input signal of the second scan driving block 210_2 through the second output terminal NEXT. In this case, the second capacitor C12 is charged by a voltage corresponding to a voltage difference between the logic low-level voltage of the first node QB[1] and the logic high-level voltage of the output control signal input terminal GCK.

During a period t16 to t17, the first clock signal SCLK1 is applied as the logic high-level and the second clock signal SCLK2 is applied as the logic low-level. The sixth transistor M16 and the seventh transistor M17 are turned off by the first clock signal SCLK1. The voltage of the first node QB[1] is maintained with the logic low-level by the voltage charged in the second capacitor C12. The first transistor M11, the third transistor M13, and the ninth transistor M19 maintain the turn-on state by the voltage of the first node QB[1]. The high-level scan signal S[1] is continuously output through the first output terminal OUT, and the logic high-level input signal is continuously output through the second output terminal NEXT. In addition, the tenth transistor M20 is turned on by the second clock signal SCLK2. The logic high-level voltage of the output control signal input terminal GCK is transmitted to the second node Q[1] through the ninth transistor M19 and the tenth transistor M20. Accordingly, the scan signal S[1] output to the first output terminal OUT and the input signal output to the second output terminal NEXT can be prevented from being fluctuated by the clock signal input to the second clock signal input terminal CLK2 while the scan driving block 210_1 outputs the logic high-level scan signal S[1].

The second scan driving block 210_2 is delayed by a first period from the first scan driving block 210_1 and then receives signals through the input signal input terminal IN, the first clock signal input terminal CLK1, and the second clock signal input terminal CLK2, and accordingly the second scan driving block 210_2 outputs the second signal S[2] after being delayed by the first period from the scan signal S[1] of the gate-on voltage of the first scan driving block 210_1. The first period corresponds to the duty (or duty cycle) of the clock signals SCLK1 and SCLK2.

With such a method, the plurality of scan driving blocks 210_1, 210_2, 210_3, 210_4, etc., sequentially output the logic low-level scan signals S[1], S[2], S[3], S[4], etc.

As described above, the plurality of scan driving blocks 210_1, 210_2, 210_3, 210_4, etc., output the scan signals S[1], S[2], S[3], S[4], etc., through the first output terminal OUT, and output input signals input to the respective next scan driving blocks through the second output terminal NEXT. Although a voltage level of a first output terminal OUT of a scan driving block coupled to one of the plurality of scan lines S1 to Sn is changed due to static electricity, short-circuit between wires, or coupling, the input signal output through the second output terminal NEXT can be normally transmitted to the next scan driving block. Therefore, although an error occurs in a scan signal of one of the plurality of scan driving blocks 210_1, 210_2, 210_3, 210_4, etc., a scan signal of the next scan driving block can be normally output. That is, erroneous operation of the scan driver due to erroneous operation in the display area, such as static electricity, short-circuit between wires, or coupling, can be reduced or minimized.

Figure 6:
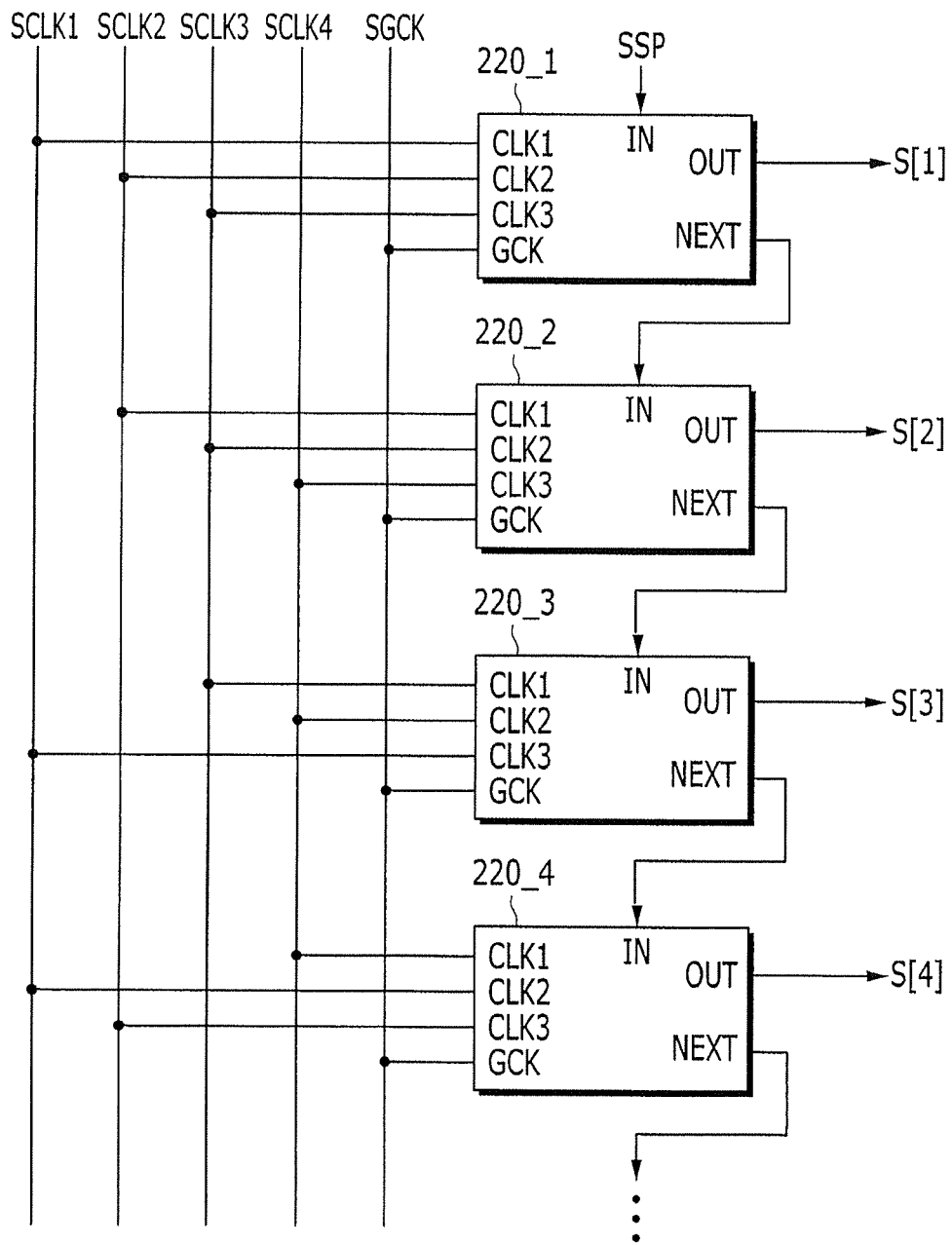
FIG. 6 is a block diagram of a scan driving device according to another exemplary embodiment of the present invention.

FIG. 6 is a block diagram of a configuration of a scan driver according to another exemplary embodiment of the present invention.

Referring to FIG. 6, the scan driver includes a plurality of sequentially arranged scan driving blocks 220_1, 220_2, 220_3, 220_4, etc. The scan driving blocks 220_1, 220_2, 220_3, 220_4, etc., receive input signals and generate scan signals S[1], S[2], S[3], S[4], etc., respectively transmitted to a plurality of scan lines S1 to Sn.

Each of the plurality of scan driving blocks 220_1, 220_2, 220_3, 220_4, etc., includes a first clock signal input terminal CLK1, a second clock signal input terminal CLK2, a third clock signal input terminal CLK3, an output control signal input terminal GCK, an input signal input terminal IN, a first output terminal OUT, and a second output terminal NEXT.

The first clock signal input terminal CLK1, the second clock signal input terminal CLK2, and the third clock signal input terminal CLK3 of each of the plurality of scan driving blocks 220_1, 220_2, 220_3, 220_4, etc., receive three out of a first clock signal SCLK1, a second clock signal SCLK2, a third clock signal SCLK3, and a fourth clock signal SCLK4. The first clock signal SCLK1, the second clock signal SCLK2, and the third clock signal SCLK3 are input to the first scan driving block 220_1. The second clock signal SCLK2, the third clock signal SCLK3, and the fourth clock signal SCLK4 are input to the second scan driving block 220_2. The third clock signal SCLK3, the fourth clock signal SCLK4, and the first clock signal SCLK1 are input to the third scan driving block 220_3. The fourth clock signal SCLK4, the first clock signal SCLK1, and the second clock signal SCLK2 are input to the fourth scan driving block 220_4. With such a method, three of the four clock signals SCLK1 to SCLK4 are rotationally input to the plurality of sequentially arranged scan driving blocks 220_1, 220_2, 220_3, 220_4, etc.

The output control signals SGCK are input to the output control signal input terminals GCL of the plurality of scan driving blocks 220_1, 220_2, 220_3, 220_4, etc.

The first output terminal OUT of each of the plurality of scan driving blocks 220_1, 220_2, 220_3, 220_4, etc., is coupled to a respective one of scan lines of the plurality of scan driving blocks 220_1, 220_2, 220_3, 220_4, etc. The scan driving blocks 220_1, 220_2, 220_3, 220_4, etc., output scan signals S[1], S[2], S[3], S[4], etc., generated according to signals input to the first clock signal input terminal CLK1, the second clock signal input terminal CLK2, the output control signal input terminal GCK, and the input signal input terminal IN, to the first output terminals OUT.

The second output terminals NEXT of the plurality of scan driving blocks 220_1, 220_2, 220_3, 220_4, etc., are coupled to input signal input terminals IN of the next scan driving blocks of the plurality of scan driving blocks 220_1, 220_2, 220_3, 220_4, etc. The scan driving blocks 220_1, 220_2, 220_3, 220_4, etc., output input signals input to the input signal input terminals IN of the next scan driving blocks to the second output terminals NEXT when the scan signals are output to the first output terminals OUT. The scan signal output to the first output terminal OUT and the input signal output to the second output terminal NEXT have substantially the same waveform.

That is, input signals output through the second output terminals NEXT of the previous scan driving blocks are input to the input signal input terminals IN of respective ones of the plurality of scan driving blocks 220_1, 220_2, 220_3, 220_4, etc. In this case, a scan start signal SSP is input to the input signal input terminal IN of the first scan driving block 220_1.

Figure 7:
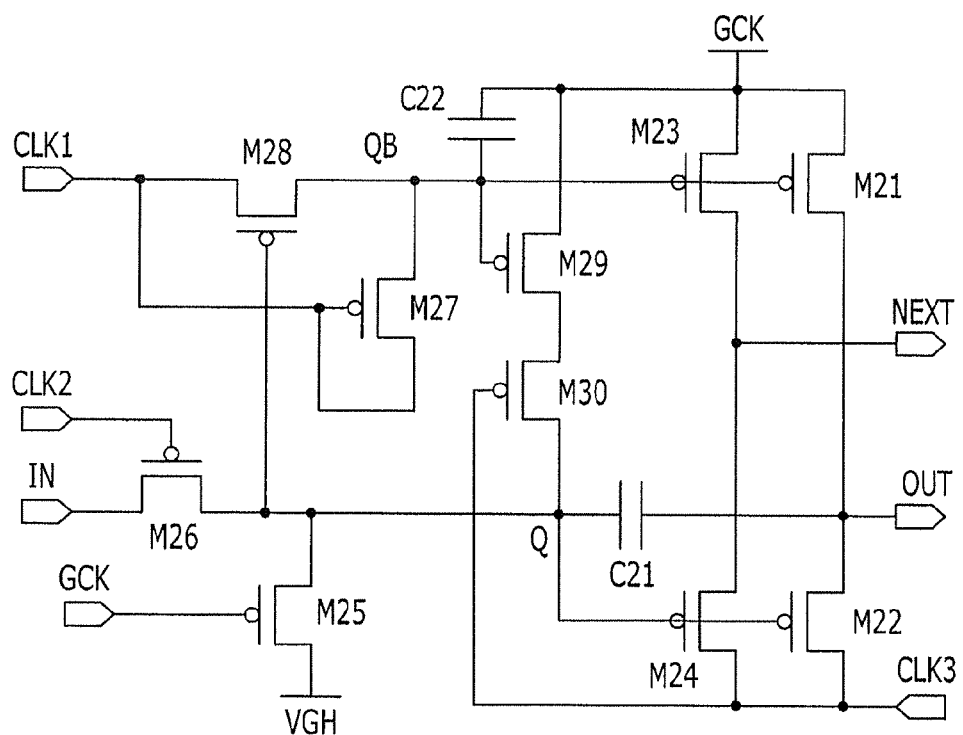
FIG. 7 is an exemplary circuit diagram of a scan driving block included in the scan driving device of FIG. 6.

FIG. 7 is a circuit diagram of the scan driving block included in the scan driver of FIG. 6 according to another exemplary embodiment of the present invention.

Referring to FIG. 7, the scan driving block includes a plurality of transistors M21, M22, M23, M24, M25, M26, M27, M28, M29, and M30, and a plurality of capacitors C21 and C22.

The first transistor M21 includes a gate electrode coupled to a first node QB, a first electrode coupled to the output control signal input terminal GCK, and a second electrode coupled to the first output terminal OUT.

The second transistor M22 includes a gate electrode coupled to a second node Q, a first electrode coupled to the third clock signal input terminal CLK3, and a second electrode coupled to the first output terminal OUT.

The third transistor M23 includes a gate electrode coupled to the first node QB, a first electrode coupled to output control signal input terminal GCK, and a second electrode coupled to the second output terminal NEXT.

The fourth transistor M24 includes a gate electrode coupled to the second node Q, a first electrode coupled to the third clock signal input terminal CLK3, and a second electrode coupled to the second output terminal NEXT.

The fifth transistor M25 includes a gate electrode coupled to the output control signal input terminal GCK, a first electrode coupled to a first power source voltage VGH, and a second electrode coupled to the second node Q.

The sixth transistor M26 includes a gate electrode coupled to the second clock signal input terminal CLK2, a first electrode coupled to the input signal input terminal IN, and a second electrode coupled to the second node Q.

The seventh transistor M27 includes a gate electrode coupled to the first clock signal input terminal CLK1, a first electrode coupled to the first clock signal input terminal CLK1, and a second electrode coupled to the first node QB.

The eighth transistor M28 includes a gate electrode coupled to the second node Q, a first electrode coupled to the first clock signal input terminal CLK1, and a second electrode coupled to the first node QB.

The ninth transistor M29 includes a gate electrode coupled to the first node QB, a first electrode coupled to the output control signal input terminal GCK, and a second electrode coupled to a first electrode of the tenth transistor M30.

The tenth transistor M30 includes a gate electrode coupled to the third clock signal input terminal CLK3, a first electrode coupled to the second electrode of the ninth transistor M29, and a second electrode coupled to the second node Q.

The first capacitor C21 includes a first electrode coupled to the second node Q, and a second electrode coupled to the first output terminal OUT. The second capacitor C22 includes a first electrode coupled to the output control signal input terminal GCK, and a second electrode coupled to the first node QB.

The plurality of transistors M21, M22, M23, M24, M25, M26, M27, M28, M29, and M30 are p-channel field effect transistors, but the present invention is not limited thereto. A gate-on voltage that turns on the plurality of transistors M21, M22, M23, M24, M25, M26, M27, M28, M29, and M30 is a logic low-level voltage, and a gate-off voltage that turns off the transistors is a logic high-level voltage. Here, the plurality of transistors M21, M22, M23, M24, M25, M26, M27, M28, M29, and M30 are described as p-channel field effect transistors, but the plurality of transistors M21, M22, M23, M24, M25, M26, M27, M28, M29, and M30 may be n-channel field effect transistors or any other suitable transistors known to those skilled in the art. A gate-on voltage that turns on the n-channel field effect transistors is a logic high-level voltage and a gate-off voltage that turns off the n-channel field effect transistors is a logic low-level voltage.

Figure 8:
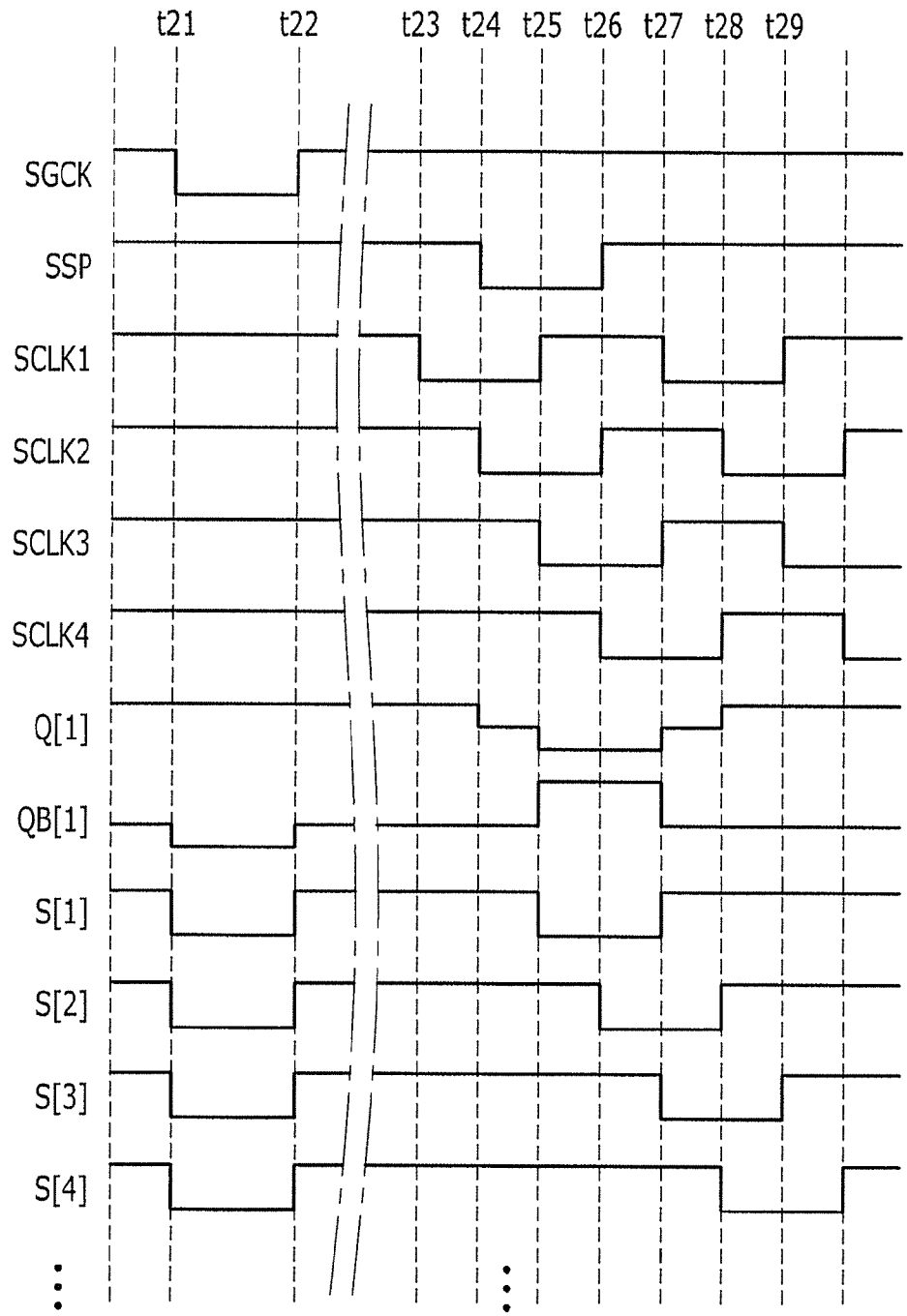
FIG. 8 is a timing diagram for illustrating a driving method of the scan driving device of FIG. 6.

FIG. 8 is a timing diagram for illustrating a driving method of the scan driver of FIG. 6.

Referring to FIG. 6 to FIG. 8, voltage levels of the first and second nodes QB[1] and Q[1] (e.g., corresponding to the first and second nodes QB and Q shown in FIG. 7) of the first scan driving block 220_1 and operation of the first scan driving block 220_1 will be described first for better understanding and ease of description.

A period t11 to t12 indicates one of the reset step (a) and the threshold voltage compensation step (b) during which the scan signals of the gate-on voltage are concurrently (e.g., simultaneously) output to plurality of scan lines S1-Sn.

During the period t11 to t12, the output control signal SGCK is applied with a logic low-level voltage, and the scan start signal SSP, the first clock signal SCLK1, the second clock signal SCLK2, the third clock signal SCLK3, and the fourth clock signal SLCK4 are applied with a logic high-level voltage. The sixth transistor M26, the seventh transistor M27, and the tenth transistor M30 are turned off by the logic high-level signal. The fifth transistor M25 is turned on by the output control signal SGCK. The first power source voltage VGH is transmitted to the second node Q[1] through the turn-on fifth transistor M25. The first power source voltage VGH is a logic high level voltage. The second transistor M22, the fourth transistor M24, and the eighth transistor M28 are turned off by the logic high-level voltage of the second node Q[1].

During the period t21 to t22, the first node QB[1] where the gate electrode of the first transistor M21 and the gate electrode of third transistor M23 are coupled is in a floated state. During a period other than the period t21 to t22, a voltage of the first node QB[1] is maintained with the logic low-level, excluding a period during which the scan signal of the gate-on voltage is output to the first output terminal OUT. Thus, the first node QB[1] in the floated state has a voltage of the logic low level or a voltage close to the logic low level. When the output control signal SGCK is lower to the logic low level from the logic high level at the time t21, the voltage of the first node QB[1] in the floated state becomes lower than the logic low-level voltage by coupling of the second capacitor C22. Accordingly, the first transistor M21 and the third transistor M23 are in the turn-on state. In addition, the logic low-level output control signal SGCK is output as a scan signal through the first output terminal OUT, and the logic low-level output control signal SGCK is output as an input of the next scan driving block through the second output terminal NEXT.

During the period t21 to t22, the signals input to the plurality of scan driving blocks 220_1, 220_2, 220_3, 2204, etc., are equivalent to each other, and therefore the plurality of scan driving blocks 220_1, 220_2, 220_3, 2204, etc., concurrently (e.g., simultaneously) output logic low-level scan signals S[1], S[2], S[3], S[4], etc.

A period after t23 is a period of the scan step (c) during which the scan signals of the gate-on voltage are sequentially output to the plurality of scan lines S1-Sn. During the period after t23, the output control signal SGCK is applied as a logic high-level voltage. The scan start signal SSP is applied with logic low-level during the period t24 to t26 and applied with logic high-level during other periods.

The first clock signal SCLK1 is applied with the logic low-level during a period t23 to t25 and applied with the logic high-level during a period t25 to t27, and thus the voltage of the first clock signal SCLK1 is iteratively changed to the logic low-level and the logic high-level. The second clock signal SCLK2 is a first clock signal SCLK1 shifted by ½ duty (or ½ duty cycle) of the first clock signal SCLK1. The third clock signal SCLK3 is a second clock signal SCLK2 shifted by ½ duty of the second clock signal SCLK2. The fourth clock signal SCLK4 is a third clock signal SCLK2 shifted by ½ duty of the third clock signal SCLK3.

That is, in the period after t23, the clock signals shifted by ½ duty of the clock signals input to the first clock signal input terminals CLK1 of the plurality of scan driving blocks 220_1, 220_2, 220_3, 220_4, etc., are input to the second clock signal input terminals CLK2, and the clock signals shifted by ½ duty of the clock signals input to the second clock signal input terminal CLK2 are input to the third clock signal input terminal CLK3.

During a period t24 to t25, the logic low-level scan start signal SSP is applied to the input signal input terminal IN of the first scan driving block 220_1, the logic low-level first clock signal SCLK1 is applied to the first clock signal input terminal CLK1, and the logic high-level third clock signal SCLK3 is applied to the third clock signal input terminal CLK3. The sixth transistor M26 and the seventh transistor M27 are turned on by the second clock signal SCLK2 and the first clock signal SCLK1, respectively. The logic low-level first clock signal SCLK1 is transmitted to the first node QB[1], and the logic low-level scan start signal SSP is transmitted to the second node Q[1]. The first transistor M21 and the third transistor M23 are turned on by the logic low-level voltage of the first node QB[1], and the second transistor M22 and the fourth transistor M24 are turned on by the logic low-level voltage of the second node Q[1]. Since the voltage of the output control signal SGCK and the voltage of the second clock signal SCLK2 are logic high-level voltages, a logic high-level scan signal S[1] is output to the first output terminal OUT. In this case, the first capacitor C21 is charged by a voltage that corresponds to a voltage difference between the logic low-level voltage of the second node Q[1] and the logic high-level voltage of the first output terminal OUT. In addition, a logic high-level input signal is output to the second output terminal NEXT. The input signal output to the second output terminal NEXT and the scan signal S[1] output to the first output terminal OUT have substantially the same waveform, and therefore the waveform of the input signal will not be illustrated.

During a period t25 to t26, the scan start signal SSP, the second clock signal SCLK2, and the third clock signal SCLK3 are applied with the logic low-level and the first clock signal SCLK1 is applied with the logic high-level. As the voltage of the third clock signal SCLK3 is decreased from the logic high-level to the logic low-level at the time t25, the voltage of the second node Q[1] becomes lower than the logic low-level by a bootstrap through the first capacitor C21. Accordingly, the second transistor M22 and the fourth transistor M24 are completely turned on. In addition, the logic low-level third clock signal SCLK3 is output as the scan signal S[1] through the first output terminal OUT. The logic low-level third clock signal SCLK3 is output as an input signal of the second scan driving block 220_2 through the second output terminal NEXT. Meanwhile, the eighth transistor M28 is turned on by the voltage of the second node Q[1], and the logic high-level first clock signal SCLK1 is transmitted to the first node QB[1]. The first transistor M21 and the third transistor M23 are turned off by the voltage of the first node QB[1].

During a period t26 to t27, the third clock signal SCLK3 is applied with logic low-level, and the scan start signal SSP, the first clock signal SCLK1, and the second clock signal SCLK2, are applied with logic high-level. The sixth transistor M26 is turned off by the second clock signal SCLK2, and the voltage of the second node Q[1] is maintained with a voltage lower than the logic low-level. Accordingly, the second transistor M22 and the fourth transistor M24 maintain the turn-on state, the logic low-level third clock signal SCLK3 is continuously output as the scan signal S[1] through the first output terminal OUT, and the third clock signal SCLK3 is continuously output as an input signal of the second scan driving block 220_2 through the second output terminal NEXT. In addition, the voltage of the first node QB[1] is maintained with logic high-level and the first transistor M21 and the third transistor M23 maintain the turn-off state.

During a period t27 to t28, the first clock signal SCLK1 is applied with logic low-level and the scan start signal SSP, the second clock signal SCLK2, and the third clock signal SCLK3 are applied with logic high-level. The seventh transistor M27 is turned on by the first clock signal SCLK1, and the logic low-level first clock signal SCLK1 is transmitted to the first node QB[1]. The voltage of the first node QB[1] becomes logic low-level, and the first transistor M21 and the third transistor M23 are turned on. In addition, the logic high-level output control signal SGCK is output as the scan signal S[1] through the first output terminal OUT, and the logic high-level output control signal SGCK is output as the input signal of the second scan driving block 220_2 through the second output terminal NEXT. As the voltage of the third clock signal SCLK3 is increased to the logic high-level from the logic low-level at the time t27, the voltage of the second node Q[1] is increased to the logic low-level from the voltage lower than the logic low-level by gate-drain coupling of the second transistor M22.

During a period t28 to t29, the first clock signal SCLK1 and the second clock signal SCLK2 are applied with logic low-level and the scan start signal SSP and the third clock signal SCLK3 are applied with logic high-level. The sixth transistor M26 and the seventh transistor M27 are turned on by the logic low-level signal. The logic low-level first clock signal SCLK1 is transmitted to the first node QB[1], and the logic high-level scan start signal SSP is transmitted to the second node Q[1]. The voltage of the first node QB[1] is maintained with the logic low-level, the logic high-level output control signal SGCK is output as the scan signal S[1] through the first output terminal OUT, and the logic high-level output control signal SGCK is output as the input signal of the second scan driving block 220_2 through the second output terminal NEXT. The voltage of the second node Q[1] becomes logic high-level.

The second scan driving block 220_2 is delayed by a first period from the first scan driving block 220_1 and then receives signals through the input signal input terminal IN, the first clock signal input terminal CLK1, the second clock signal input terminal CLK2, and the third clock signal input terminal CLK3. Therefore, the second scan driving block 220_2 outputs a scan signal S[2], which is delayed by the first period from the gate-on voltage of the scan signal S[1]. The first period corresponds to ½ duty of the clock signals SCLK1, SCLK2, SCLK3, and SCLK4.

With such a method, the plurality of scan driving blocks 220_1, 220_2, 220_3, 220_4, etc., sequentially output the logic low-level scan signals S[1], S[2], S[3], S[4], etc.

Although a voltage level of a first output terminal OUT of a scan driving block coupled to one of the plurality of scan lines S1 to Sn is changed due to static electricity, short-circuit between wires, or coupling, the input signal output through the second output terminal NEXT can be normally transmitted to the next scan driving block. Therefore, although an error occurs in a scan signal of one of the plurality of scan driving blocks 220_1, 220_2, 220_3, 220_4, etc., a scan signal of the next scan driving block can be normally output. That is, erroneous operation of the scan driver due to erroneous operation in the display area, such as static electricity, short-circuit between wires, or coupling, can be reduced or minimized.

Figure 9:
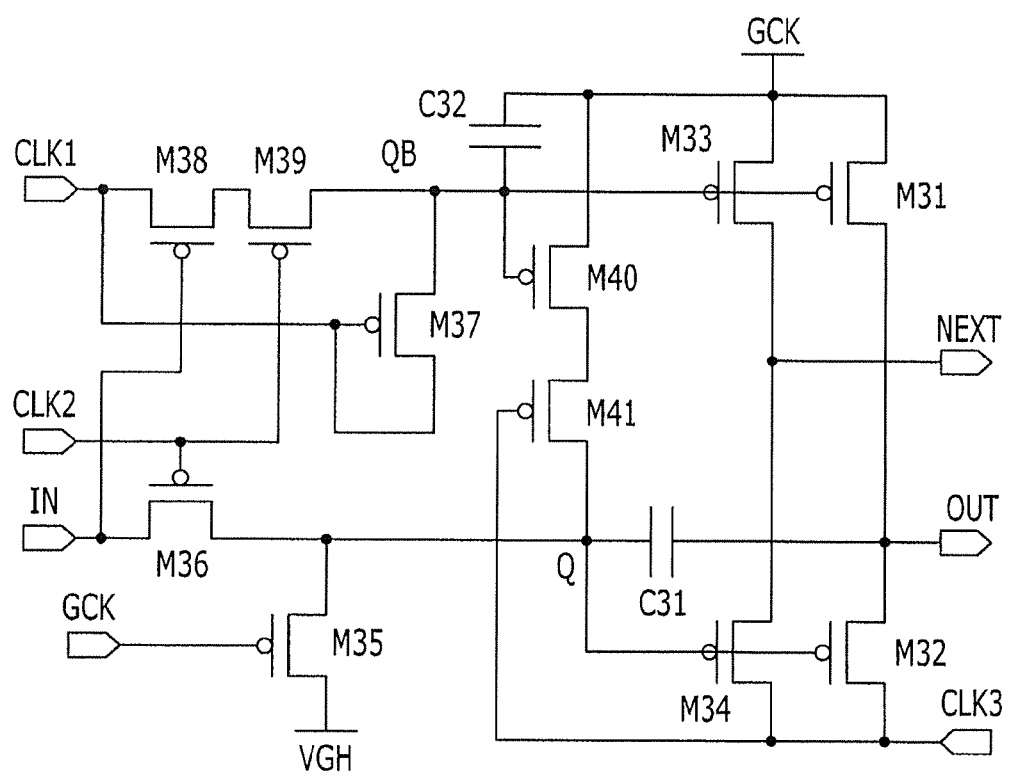
FIG. 9 is another exemplary circuit diagram of a scan driving block included in the scan driving device of FIG. 6.

FIG. 9 is a circuit diagram of a scan driving block included in the scan driver of FIG. 6 according to another exemplary embodiment of the present invention.

Referring to FIG. 9, the scan driving block includes a plurality of transistors M31, M32, M33, M34, M35, M36, M37, M38, M39, M40, and M41 and a plurality of capacitors C31 and C32.

The first transistor M31 includes a gate electrode coupled to a first node QB, a first electrode coupled to an output control signal input terminal GCK, and a second electrode coupled to a first output terminal OUT.

The second transistor M32 includes a gate electrode coupled to the second node Q, a first electrode coupled to a third clock signal input terminal CLK3, and a second electrode coupled to the first output terminal OUT.

The third transistor M33 includes a gate electrode coupled to the first node QB, a first electrode coupled to the output control signal input terminal GCK, and a second electrode coupled to a second output terminal NEXT.

The fourth transistor M34 includes a gate electrode coupled to the second node Q, a first electrode coupled to the third clock signal input terminal CLK3, and a second electrode coupled to the second output terminal NEXT.

The fifth transistor M35 includes a gate electrode coupled to the output control signal input terminal GCK, a first electrode coupled to a first power source voltage VGH, and a second electrode coupled to the second node Q.

The sixth transistor M36 includes a gate electrode coupled to the second clock signal input terminal CLK2, a first electrode coupled to an input signal input terminal IN, and a second electrode coupled to the second node Q.

The seventh transistor M37 includes a gate electrode coupled to the first clock signal input terminal CLK1, a first electrode coupled to the first clock signal input terminal CLK1, and a second electrode coupled to the first node QB.

The eighth transistor M38 includes a gate electrode coupled to the input signal input terminal IN, a first electrode coupled to the first clock signal input terminal CLK1, and a second electrode coupled to a first electrode of the ninth transistor M39.

The ninth transistor M39 includes a gate electrode coupled to the second clock signal input terminal CLK2, a first electrode coupled to the second electrode of the eighth transistor M38, and a second electrode coupled to the first node QB.

The tenth transistor M40 includes a gate electrode coupled to the first node QB, a first electrode coupled to the output control signal input terminal GCK, and a second electrode coupled to a first electrode of the eleventh transistor M41.

The eleventh transistor M41 includes a gate electrode coupled to the third clock signal input terminal CLK3, the first electrode coupled to the second electrode of the tenth transistor M40, and a second electrode coupled to the second node Q.

The first capacitor C31 includes a first electrode coupled to the second node Q and a second electrode coupled to the first output terminal OUT. The second capacitor C32 includes a first electrode coupled to the output control signal input terminal GCK and a second electrode coupled to the first node QB.

The scan driving block of FIG. 9 is different from the scan driving block of FIG. 7 in a connection structure between the eighth transistor M38 and the ninth transistor M39. In the scan driving block of FIG. 7, the eighth transistor M28 transmits a clock signal input to a first clock signal input terminal CLK1 to the first node QB according to a clock signal input to the second clock signal input terminal CLK2 and an input signal input to the input signal input terminal IN. Similarly, in the scan driving block of FIG. 9, the eighth transistor M38 and the ninth transistor M39 transmit the clock signal input to the first clock signal input terminal CLK1 to the first node QB according to the clock signal input to the second clock signal input terminal CLK2 and the input signal input to the input signal input terminal IN. That is, operation of the scan driving block of FIG. 9 and operation of the scan driving block of FIG. 7 are equivalent (or substantially similar) to each other. Thus, the operation of the scan driving block of FIG. 9 will not be described in detail.

Figure 10:
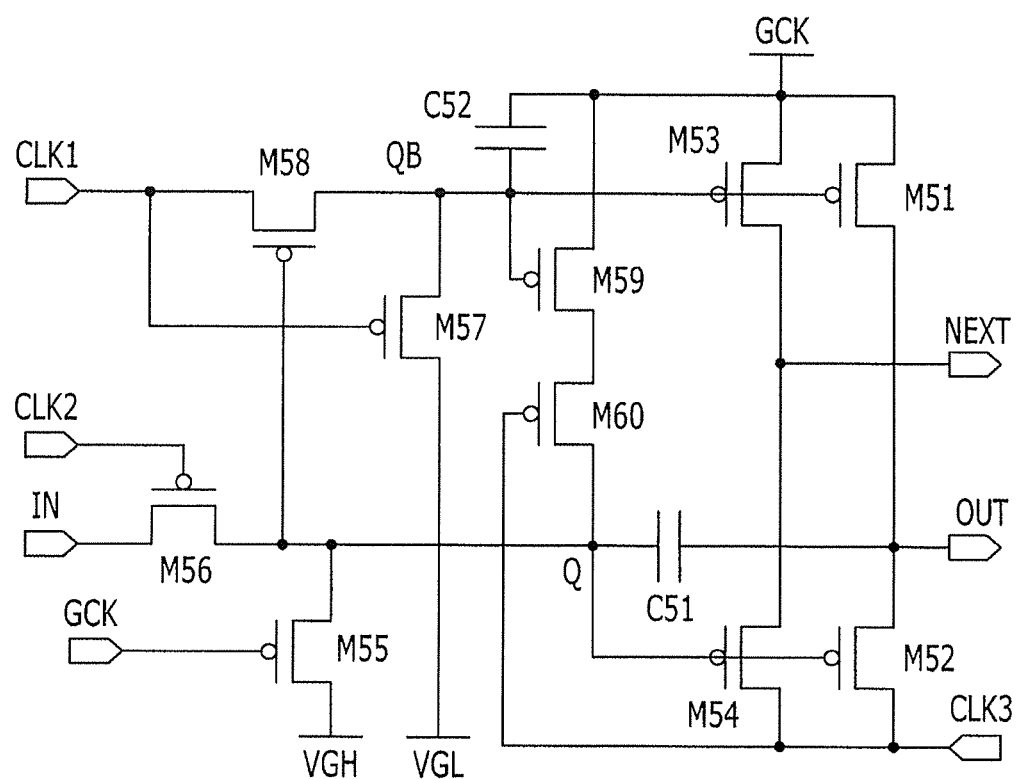
FIG. 10 is another exemplary circuit diagram of a scan driving block included in the scan driving device of FIG. 6.

FIG. 10 is a circuit diagram of a scan driving block included in the scan driver of FIG. 6 according to another exemplary embodiment of the present invention.

Referring to FIG. 10, the scan driving block includes a plurality of transistors M51, M52, M53, M54, M55, M56, M57, M58, M59, and M60 and a plurality of capacitors C51 and C52.

The first transistor M51 includes a gate electrode coupled to a first node QB, a first electrode coupled to the output control signal input terminal GCK, and a second electrode coupled to the first output terminal OUT.

The second transistor M52 includes a gate electrode coupled to a second node Q, a first electrode coupled to the third clock signal input terminal CLK3, and a second electrode coupled to the first output terminal OUT.

The third transistor M53 includes a gate electrode coupled to the first node QB, a first electrode coupled to the output control signal input terminal GCK, and a second electrode coupled to the second output terminal NEXT.

The fourth transistor M54 includes a gate electrode coupled to the second node Q, a first electrode coupled to the third clock signal input terminal CLK3, and a second electrode coupled to the second output terminal NEXT.

The fifth transistor M55 includes a gate electrode coupled to the output control signal input terminal GCK, a first electrode coupled to a first power source voltage VGH, and a second electrode coupled to the second node Q.

The sixth transistor M56 includes a gate electrode coupled to the second clock signal input terminal CLK2, a first electrode coupled to the input signal input terminal IN, and a second electrode coupled to the second node Q.

The seventh transistor M57 includes a gate electrode coupled to the first clock signal input terminal CLK1, a first electrode coupled to a second power source voltage VGL, and a second electrode coupled to the first node QB. The second power source voltage VGL has a logic low-level voltage.

The eighth transistor M58 includes a gate electrode coupled to the second node Q, a first electrode coupled to the first clock signal input terminal CLK1, and a second electrode coupled to the first node QB.

The ninth transistor M59 includes a gate electrode coupled to the first node QB, a first electrode coupled to the output control signal input terminal GCK, and a second electrode coupled to a first electrode of the tenth transistor M60.

The tenth transistor M60 includes a gate electrode coupled to the third clock signal input terminal CLK3, the first electrode coupled to the second electrode of the ninth transistor M59, and a second electrode coupled to the second node Q.

The first capacitor C51 includes a first electrode coupled to the second node Q and a second electrode coupled to the first output terminal OUT. The second capacitor C52 includes a first electrode coupled to the output control signal input terminal GCK and a second electrode coupled to the first node QB.

The scan driving block of FIG. 10 is different from the scan driving block of FIG. 7 in that the seventh transistor M57 is coupled to the second power source voltage VGL. However, similar to the seventh transistor M27, the seventh transistor M57 also transmits a logic low-level voltage to the first node QB according to the clock signal input to the first clock signal input terminal CLK1. That is, operation of the scan driving block of FIG. 10 and operation of the scan driving block of FIG. 7 are equivalent (or substantially similar) to each other. Thus, the operation of the scan driving block of FIG. 10 will not be described in detail.

While the present invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents. Therefore, it will be understood that those skilled in the art may perform various modifications and equivalent embodiments from the description. Accordingly, the technical scope of the present invention will be determined based on technical spirits of the claims and their equivalents.

DESCRIPTION OF SOME OF THE SYMBOLS

100: signal controller
200: scan driver
210: scan driving block
300: data driver
500: display unit

What is claimed is:

1. A scan driver comprising a plurality of sequentially arranged scan driving blocks, each of the scan driving blocks comprising:
    a first transistor having a gate electrode coupled to a first node and configured to receive a clock signal input to a first clock signal input terminal, a first electrode configured to receive an output control signal, and a second electrode coupled to a first output terminal;
    a second transistor having a gate electrode coupled to a second node configured to receive an input signal transmitted according to a clock signal input to a second clock signal input terminal, a first electrode coupled to a third clock signal input terminal, and a second electrode coupled to the first output terminal;
    a third transistor having a gate electrode coupled to the first node, a first electrode configured to receive the output control signal, and a second electrode coupled to a second output terminal; and
    a fourth transistor having a gate electrode coupled to the second node, a first electrode coupled to the third clock signal input terminal, and a second electrode coupled to the second output terminal, wherein the first output terminal is coupled to a scan line, and the second output terminal is coupled to an input signal input terminal of a next scan driving block of the scan driving blocks.

2. The scan driver of claim 1, wherein, when a scan signal is output to the first output terminal, an input signal input to the input signal input terminal of the next scan driving block is output to the second output terminal.

3. The scan driver of claim 2, wherein the scan signal output to the first output terminal and the input signal output to the second output terminal have substantially the same waveform.

4. The scan driver of claim 1, wherein each of the scan driving blocks further comprises a first capacitor having a first electrode coupled to the second node and a second electrode coupled to the first output terminal.

5. The scan driver of claim 4, wherein each of the scan driving blocks further comprises a second capacitor having a first electrode configured to receive the output control signal and a second electrode coupled to the first node.

6. The scan driver of claim 5, wherein each of the scan driving blocks further comprises a fifth transistor having a gate electrode configured to receive the output control signal, a first electrode coupled to a first power source, and a second electrode coupled to the second node.

7. The scan driver of claim 6, wherein each of the scan driving blocks further comprises a sixth transistor having a gate electrode coupled to the second clock signal input terminal, a first electrode configured to receive the input signal, and a second electrode coupled to the second node.

8. The scan driver of claim 7, wherein each of the scan driving blocks further comprises a seventh transistor having a gate electrode coupled to the first clock signal input terminal, a first electrode coupled to the first clock signal input terminal, and a second electrode coupled to the first node.

9. The scan driver of claim 8, wherein each of the scan driving blocks further comprises an eighth transistor having a gate electrode coupled to the second node, a first electrode coupled to the first clock signal input terminal, and a second electrode coupled to the first node.

10. The scan driver of claim 9, wherein each of the scan driving blocks further comprises:
    a ninth transistor having a gate electrode coupled to the first node and a first electrode configured to receive the output control signal; and
    a tenth transistor having a gate electrode coupled to the third clock signal input terminal, a first electrode coupled to a second electrode of the ninth transistor, and a second electrode coupled to the second node.

11. The scan driver of claim 8, wherein each of the scan driving blocks further comprises:
    an eighth transistor having a gate electrode configured to receive the input signal, and a first electrode coupled to the first clock signal input terminal; and
    a ninth transistor having a gate electrode coupled to the second clock signal input terminal, a first electrode coupled to a second electrode of the eighth transistor, and a second electrode coupled to the first node.

12. The scan driver of claim 11, wherein each of the scan driving blocks further comprises:
    a tenth transistor having a gate electrode coupled to the first node and a first electrode configured to receive the output control signal; and
    an eleventh transistor having a first electrode coupled to the third clock signal input terminal, a first electrode coupled to a second electrode of the tenth transistor, and a second electrode coupled to the second node.

13. The scan driver of claim 7, wherein each of the scan driving blocks further comprises a seventh transistor having a gate electrode coupled to the first clock signal input terminal, a first electrode coupled to a second power source, and a second electrode coupled to the first node.

14. The scan driver of claim 13, wherein each of the scan driving blocks further comprises an eighth transistor having a gate electrode coupled to the second node, a first electrode coupled to the first clock signal input terminal, and a second electrode coupled to the first node.

15. The scan driver of claim 14, wherein each of the scan driving blocks further comprises:
   a ninth transistor having a gate electrode coupled to the first node and a first electrode configured to receive the output control signal; and
   a tenth transistor having a gate electrode coupled to the third clock signal input terminal, a first electrode coupled to a second electrode of the ninth transistor, and a second electrode coupled to the second node.

16. The scan driver of claim 1, wherein a first clock signal is input to the first clock signal input terminals and the second clock signal input terminals of a plurality of first scan driving blocks of the scan driving blocks, and a second clock signal is input to the third clock signal input terminals of the first scan driving blocks, and
   the second clock signal is input to the first clock signal input terminals and the second clock signal input terminals of a plurality of second scan driving blocks of the scan driving blocks, and the first clock signal is input to the third clock signal input terminals of the second scan driving blocks.

17. The scan driver of claim 16, wherein the second clock signal is shifted from the first clock signal by a duty of the first clock signal.

18. The scan driver of claim 17, wherein a scan signal of previous second scan driving blocks of the second scan driving blocks are input to the input signal input terminals of the first scan driving blocks, and scan signals of previous first scan driving blocks of the first scan driving blocks are input to the input signal input terminals of the second scan driving blocks.

19. The scan driver of claim 1, wherein a first clock signal is input to the first clock signal input terminal of a first scan driving block of the scan driving blocks, a second clock signal is input to a second clock signal input terminal of the first scan driving block, and a third clock signal is input to the third clock signal input terminal of the first scan driving block, and
   the second clock signal is a signal shifted from the first clock signal by ½ duty of the first clock signal and the third clock signal is a signal shifted from the second clock signal by ½ duty of the second clock signal.

20. The scan driver of claim 19, wherein the second clock signal is input to the first clock signal input terminal of a second scan driving block of the scan driving blocks, the third clock signal is input to the second clock signal input terminal of the second scan driving block, and a fourth clock signal that is a signal shifted from the third clock signal by ½ duty of the third clock signal, is input to the third clock signal input terminal of the second scan driving block.

21. The scan driver of claim 20, wherein the third clock signal is input to the first clock signal input terminal of a third scan driving block of the scan driving blocks, the fourth clock signal is input to the second clock signal input terminal of the third scan driving block, and the first clock signal is input to the third clock signal input terminal of the third scan driving block.

22. The scan driver of claim 21, wherein the fourth clock signal is input to a first clock signal input terminal of a fourth scan driving block of the scan driving blocks, the first clock signal is input to the second clock signal input terminal of the fourth scan driving block, and the second clock signal is input to the third clock signal input terminal of the fourth scan driving block.

23. A method for driving a scan driver including a plurality of scan driving blocks, each comprising a first transistor having a gate electrode coupled to a first node and transmitting an output control signal to a first output terminal, a second transistor having a gate electrode coupled to a second node and transmitting a first clock signal to the first output terminal, a third transistor having a gate electrode coupled to the first node and transmitting the output control signal to a second output terminal, a fourth transistor having a gate electrode coupled to the second node and transmitting the first clock signal to the second output terminal, and a capacitor coupled to the second node and the first output terminal, the method comprising:
   changing the first clock signal to a gate-on voltage;
   turning on the second transistor and the fourth transistor by a bootstrap through the capacitor;
   outputting the first clock signal of the gate-on voltage as a scan signal to the first output terminal; and
   outputting the first clock signal of the gate-on voltage as an input signal of a next scan driving block to the second output terminal.

24. The method for driving the scan driver of claim 23, further comprising:
   applying an input signal of a gate-on voltage output through the second output terminal of a previous scan driving block of the scan driving blocks, to the second node before the first clock signal is changed to the gate-on voltage;
   turning on the second transistor by the gate-on voltage of the second node and outputting the first clock signal of a gate-off voltage as the scan signal to the first output terminal; and
   charging the capacitor with the gate-on voltage of the second node and the gate-off voltage of the output terminal.

25. The method for driving the scan driver of claim 23, comprising:
   changing a voltage of the first node according to the output control signal of the gate-on voltage, concurrently applied to the scan driving blocks;
   turning on the first transistor from the changing of the voltage of the first node and outputting the outputting control signal of the gate-on voltage as the scan signal to the first output terminal; and
   turning on the third transistor by the changing of the voltage of the first node and outputting the output control signal of the gate-on voltage as an input signal of a next scan driving block of the scan driving blocks, to the second output terminal.

26. The method for driving the scan driver of claim 25, further comprising transmitting a gate-off voltage to the second node according to the output control signal of the gate-on voltage.

* * * * *